(12) United States Patent
Lee

(10) Patent No.: US 6,943,602 B1
(45) Date of Patent: Sep. 13, 2005

(54) DELAY LOCKED LOOP AND LOCKING METHOD THEREOF

(75) Inventor: Hyun-Woo Lee, Kyoungki-do (KR)

(73) Assignee: Hynix Semiconductor, Inc., (KR)

( * ) Notice: Subject to any disclaimer, the term of this patent is extended or adjusted under 35 U.S.C. 154(b) by 0 days.

(21) Appl. No.: 11/026,970

(22) Filed: Dec. 30, 2004

(30) Foreign Application Priority Data

Oct. 29, 2004 (KR) ........................ 10-2004-0087313

(51) Int. Cl.$^7$ .............................................. H03L 7/06
(52) U.S. Cl. ...................................... 327/158; 327/149
(58) Field of Search ........................... 327/141, 147, 327/149, 152, 153, 158, 161

(56) References Cited

U.S. PATENT DOCUMENTS

| | | | | |
|---|---|---|---|---|
| 5,935,257 | A * | 8/1999 | Nishimura | ............... 713/503 |
| 6,212,126 | B1 * | 4/2001 | Sakamoto | ............... 365/233 |
| 6,339,533 | B1 * | 1/2002 | Lee et al. | ............... 361/704 |
| 6,594,197 | B2 * | 7/2003 | Okuda et al. | ............... 365/233 |
| 6,724,228 | B2 * | 4/2004 | Kashiwazaki | ............... 327/158 |
| 6,801,472 | B2 * | 10/2004 | Lee | ............... 365/233 |
| 6,803,826 | B2 * | 10/2004 | Gomm et al. | ............... 331/11 |
| 6,819,626 | B2 * | 11/2004 | Okuda et al. | ............... 365/233 |

\* cited by examiner

*Primary Examiner*—Timothy P. Callahan
*Assistant Examiner*—Cassandra Cox
(74) *Attorney, Agent, or Firm*—Blakely Sokoloff Taylor & Zafman

(57) ABSTRACT

The present invention provides a delay locked loop of a semiconductor memory device for preventing a stuck fail. The DLL of the present invention includes: a buffer for outputting a first clock corresponding to an in-phase of an external clock and outputting a second clock corresponding to an out-of-phase of the external clock; a phase comparator for outputting a control signal to increase/decrease a delay amount after comparing the first clock with a phase of a feedback clock; a shift register for outputting a shift signal in accordance with the control signal; a multiplexing unit for selecting one between the first and the second clocks by using the output of the phase comparator and the output of the shift register.

18 Claims, 9 Drawing Sheets

DELAY LOCKED LOOP AND LOCKING METHOD THEREOF

FIELD OF INVENTION

The present invention relates to a semiconductor memory device; and, more particularly, to a delay locked loop of a semiconductor memory device and a locking method thereof.

DESCRIPTION OF PRIOR ART

In general, a clock signal of a system or a circuit is used as a reference for synchronizing an execution timing and guaranteeing an error-free high speed operation. When an external clock signal of an external circuit is used in an internal circuit, a clock signal skew is generated from an internal circuit because of timing gap between the external clock signal and the internal clock signal. A delay locked loop (hereinafter, referred as DLL) compensates the clock signal skew for equalizing a phase of the internal clock signal to that of the external clock signal.

In addition, the DDL are broadly used in a synchronous semiconductor memory device including a double data rate synchronous dynamic random access memory (DDR SDRAM) because it has an advantage with being less affected by a noise, as compared to a phase locked loop (hereinafter, referred to as PLL). Among various types of the DLL, a register-controlled DLL is the most generally used.

The register-controlled DLL in the synchronous semiconductor memory device synchronizes a data output with the external clock signal by fore-reflecting a negative delay after receiving the external clock signal and compensating a delay value of data and clock signal paths.

FIG. 1 is a block diagram setting forth a conventional register-controlled DLL for use in the semiconductor memory device.

Referring to FIG. 1, the conventional register-controlled DLL includes a first clock buffer 111, a second clock buffer 112, a clock divider 113, a delay line block 110, a phase comparator 119, a delay control signal generator 123, a first DLL driver 120, a second DLL driver 121 and a delay model. Herein, the delay line block is provided with a first delay line 114, a second delay line 115 and a third delay line 116. The delay control signal generator 123 is provided with a shift register 117 and a shift controller 118 for controlling the first, the second and the third delay lines 114, 115 and 116.

The first clock buffer 111 receives an external clock bar signal /clk and generates a first internal clock fall_clk in synchronization with a falling edge of an external clock signal. The second clock buffer 112 receives the external clock signal clk and generates a second internal clock signal rise_clk in synchronization with a rising edge of the external clock signal clk.

The clock divider 113 divides the second internal clock signal rise_clk by N so as to generate a delay monitoring clock dly_in and a reference clock ref, wherein N is a positive integer and typically, N is set to be 8. The first DLL driver 120 drives a first delayed internal clock ifclk of the first delay line 114 to generate a first DLL clock fclk_dll and the second driver 121 drives a second delayed internal clock irclk of the second delay line 115 and generates a second DLL clock rclk_dll.

The delay model 122 is implemented as such a condition that the output of the third delay line 116 has a same clock path with an actual clock. The phase comparator 119 compares a phase of a rising edge of a feedback clock feedback outputted from the delay mode 122 with a phase of a rising edge of a reference clock ref. The shift controller 118 outputs shift control signals SR and SL for shifting clock phases of the first, the second and the third delay lines 114, 115 and 116, and outputs a delay locked signal dll_lockb in response to a control signal ctrl outputted from the phase comparator 119.

The shift register 117 controls a respective delay amount of the first, the second and the third delay lines 114, 115 and 116 by mans of the shift control signals SR and SL of the shift controller 118, wherein the first, the second and the third delay lines 114, 115 and 116 receive the first internal clock signal fall_clk, the second internal clock signal rise_clk and the delay monitoring clock dly_in, respectively.

Herein, the delay model 122 which is so called a replica circuit includes a dummy clock buffer, a dummy output buffer and a dummy load.

FIGS. 2A and 2B are timing diagrams setting forth a desired delay amount in order that a clock may be locked in the conventional DLL.

Referring to FIG. 2A, in case that the delay monitoring clock dly_in is outputted as a feedback clock feedback through the delay model 122, a phase of the feedback clock feedback leads a phase of the reference clock ref by a predetermined period D. Therefore, the delay unit 100 delays the feed back clock for the predetermined period D so as to synchronize the feedback clock feedback with the reference clock ref.

Referring to FIG. 2B, however, in case that the rising edge of the feedback clock lags behind the rising edge of the reference clock ref, the feedback clock feedback is delayed by a predetermined delay time corresponding to one period of the feedback clock feedback and is synchronized with the rising edge of the reference clock ref. The reason is that the delay amount of the feedback clock feedback cannot be reduced any longer because the DLL is preset to use a minimum number of delay units at an initial operation state of the DLL.

Therefore, sufficient number of delay units are required for delaying the feedback clock feedback by the predetermined delay time corresponding to one period of the feedback clock feedback in the DLL. Furthermore, in this case, it is noted that a delay amount with respect to a slowest operational frequency should be considered.

Additionally, in order to delay the feedback clock by the predetermined delay time corresponding to one period of the clock signal, the delay line block 110 should be enlarged so as to incur a lot of current consumption after all. In fact, the delay line block occupies a large area among elements in the DLL, generally. Moreover, since the feedback clock feedback is delayed by one period and then is synchronized with the reference clock ref, there is happened a problem that a locking time must be elongated.

FIG. 3 is a block diagram setting forth another conventional DLL for use in the semiconductor memory device to overcome the above problems.

Referring to FIG. 3, a phase comparator 313 compares a phase of an external clock clk with a phase of a feedback clock feedback and then, determines to directly apply the external clock clk to a delay line or to apply an inverted external clock to the delay line 317. Therefore, according to another conventional DLL, it is sufficient to prepare only the number of delay unit corresponding to a half period of the operational frequency.

FIGS. 4A and 4B are timing diagrams setting forth a locking procedure of another conventional DLL.

Referring to FIG. 4A, a delay time tD of the feedback clock feedback is less than a half period tCK/2 of an operation frequency. In this case, since the delay amount for synchronizing the feedback clock feedback with the external clock clk is more than a half period tCK/2, an external clock bar signal /clk is used instead of the external clock signal clk. As a result, it is possible to synchronize the feedback clock feedback in a virtue of a small delay amount because the feedback clock feedback is delayed by a delay time corresponding to tCK/2−tD.

Referring to FIG. 4B, a delay time tD is more than the half period tCK/2 so that the external clock clk is used for delaying the feedback clock feedback because the delay amount is less than the half period tCK/2.

However, another conventional DLL depicted in FIG. 3 has also a drawback for following reasons.

That is, if the feedback clock feedback and the external clock clk are very coadjacent to each other so that the phase comparator 313 cannot compare the phase of the feedback clock feedback with the phase of the external clock clk, there is happened an error in the phase comparator 313. Herein, such a zone that the feedback clock is very near to the external clock is so called a dead-zone.

FIG. 5 is a timing diagram setting forth the above error happened in another conventional DLL.

Provided that the feedback clock has a delay time tD which is approximate to the half period Tck/2, the feedback clock feedback_clk has ideally a timing as a third clock signal depicted in FIG. 5. In such an ideal case, the phase comparator 313 commands to increase the delay amount of the present feedback clock feedback_clkb_i so that the phase of the feedback clock feedback_clkb_i is gradually delayed to be synchronized with the external clock.

Actually, however, there is happened a phase error that the rising edge of an actual feedback clock feedback_clkb_r is beyond the rising edge of the external clock clk according to various factors. That is, in case that the feedback clock feedback_clkb_r is within the dead-zone of the phase comparator 313, or in case that a voltage applied to the DLL is varied, or in case that a temperature of the DLL is varied, the phase error may occur. According to the phase error, therefore, the phase comparator 313 commands to reduce a delay amount. That is, the phase comparator 313 commands to lead the phase of the feedback clock feedback_clkb_r. However, the DLL cannot delay the phase of the feedback clock feedback_clkb_r any more because the DLL is preset that the delay operation is performed initially through the minimum number of delay unit.

As a result, another conventional DLL shows a serious problem that the internal clock cannot be synchronized with the external clock according to the various factors. This is so called a stuck fail.

SUMMARY OF INVENTION

It is, therefore, an object of the present invention to provide a delay locked loop of a semiconductor memory device for preventing a stuck fail.

It is, therefore, another object of the present invention to provide a locking method of a delay locked loop of a semiconductor memory device for preventing the stuck fail.

In accordance with an aspect of the present invention, there is provided a delay locked loop with at least one delay line, including: a buffering means for outputting a first clock corresponding to an in-phase of an external clock and outputting a second clock corresponding to an out-of-phase of the external clock; a phase comparing means for outputting a control signal to increase/decrease a delay amount after comparing the first clock with a phase of a feedback clock; a shift register for outputting a shift signal in accordance with the control signal; a multiplexing means for selecting one between the first and the second clocks by using the output of the phase comparator and the output of the shift register.

In accordance with another aspect of the present invention, there is provided a locking method of a delay locked loop with at least one delay line, including the steps of: a) outputting a first clock corresponding to an in-phase of an external clock and a second clock corresponding to an out-of-phase of the external clock; b) outputting a command to increase or decrease a delay amount by comparing a phase of the external clock with a phase of a feedback clock; c) outputting a shift signal in accordance with the command to increase or decrease the delay amount; and d) selecting one clock between the first and the second clocks by using the command and the shift signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop of a semiconductor memory device in accordance with a preferred embodiment of the present invention will be described in detail referring to the accompanying drawings.

Figure 1:
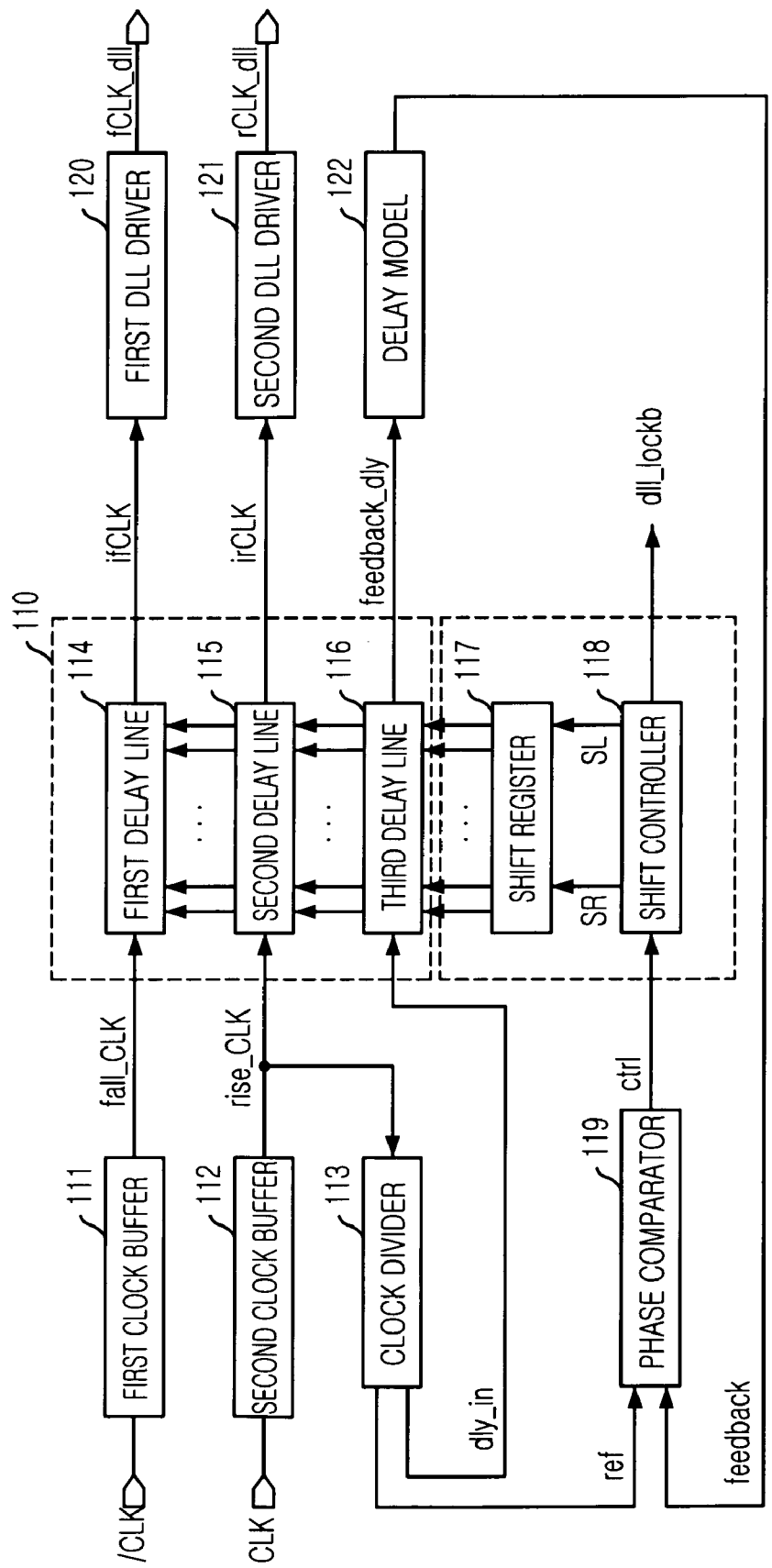
FIG. 1 is a block diagram setting forth a conventional register-controlled DLL for use in the semiconductor memory device.
Figure 2A:
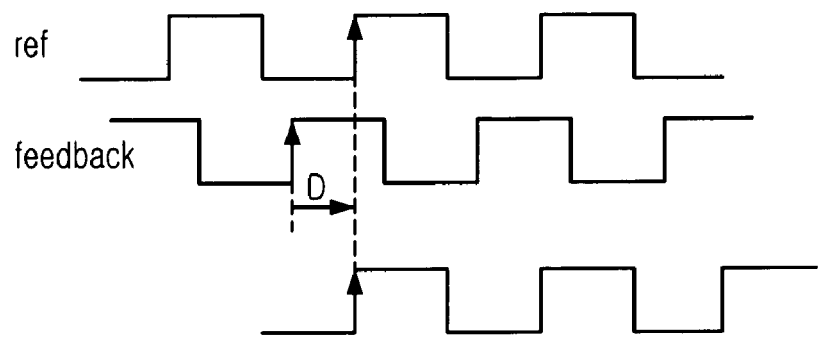
FIGS. 2A and 2B are timing diagrams setting forth a desired delay amount in order that an internal clock may be synchronized with an external clock in the conventional DLL.
Figure 2B:
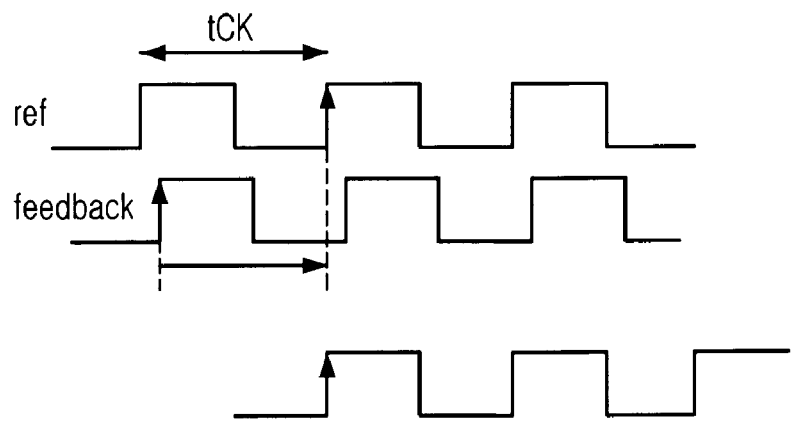
Figure 3:
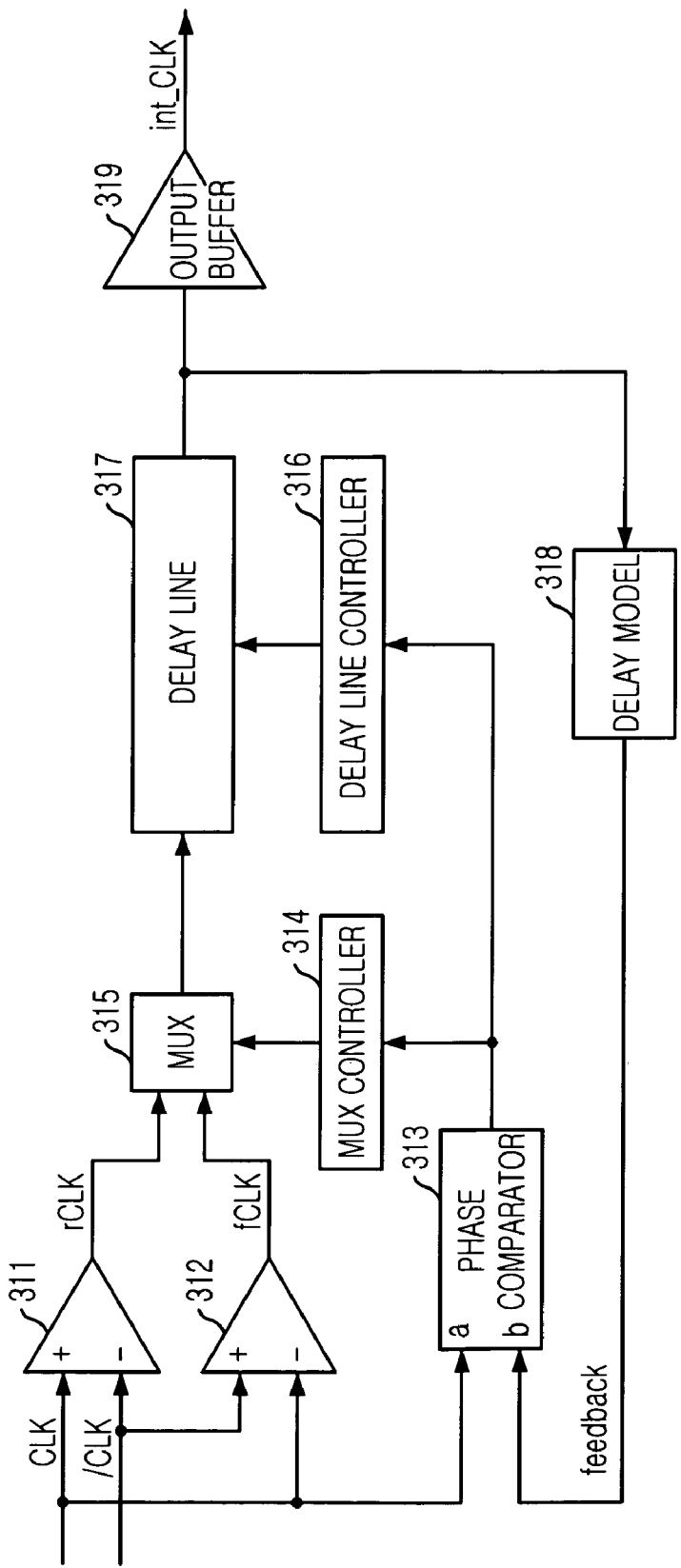
FIG. 3 is a block diagram setting forth another conventional DLL for use in the semiconductor memory device to overcome the above problems.
Figure 4A:
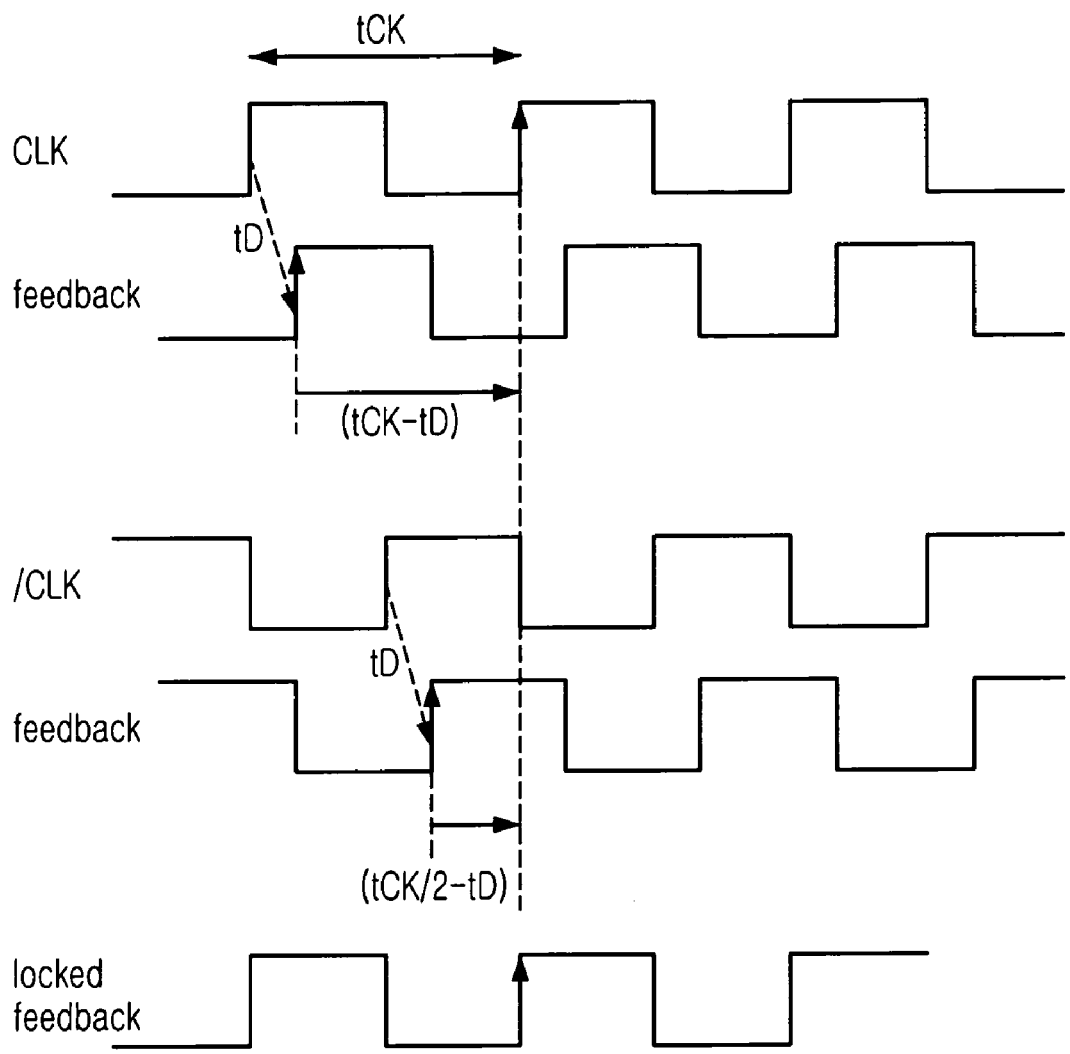
FIGS. 4A and 4B are timing diagrams setting forth a locking procedure of another conventional DLL.
Figure 4B:
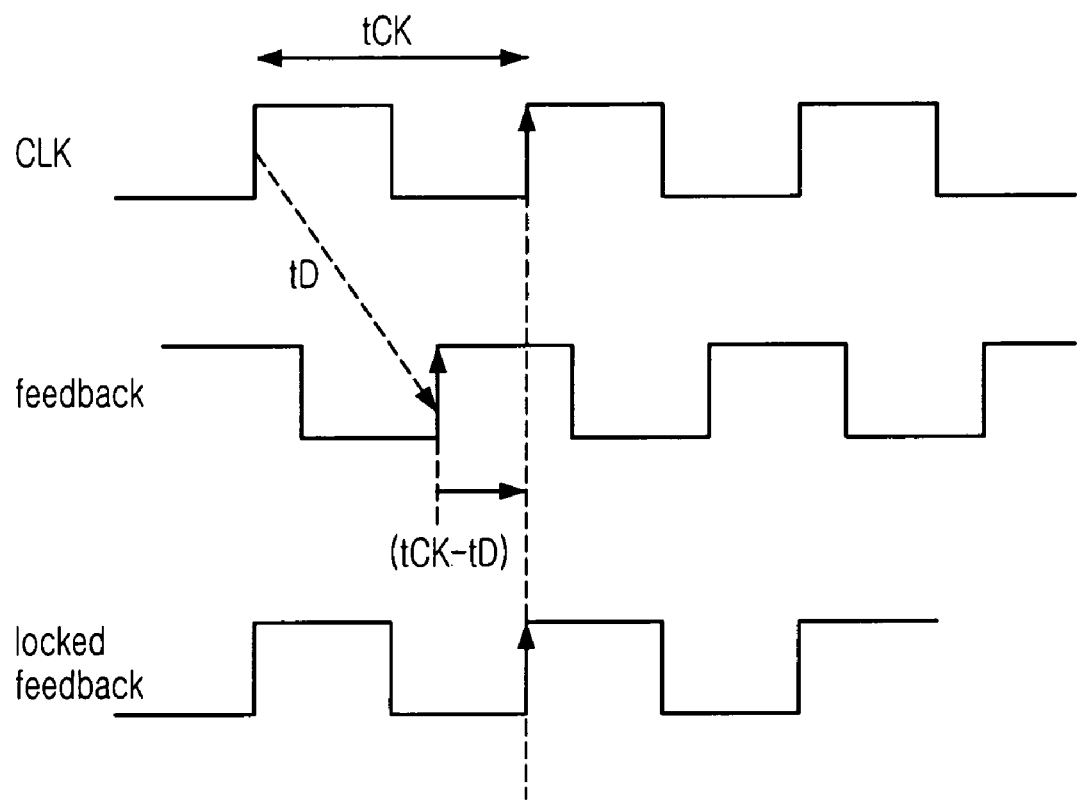
Figure 5:
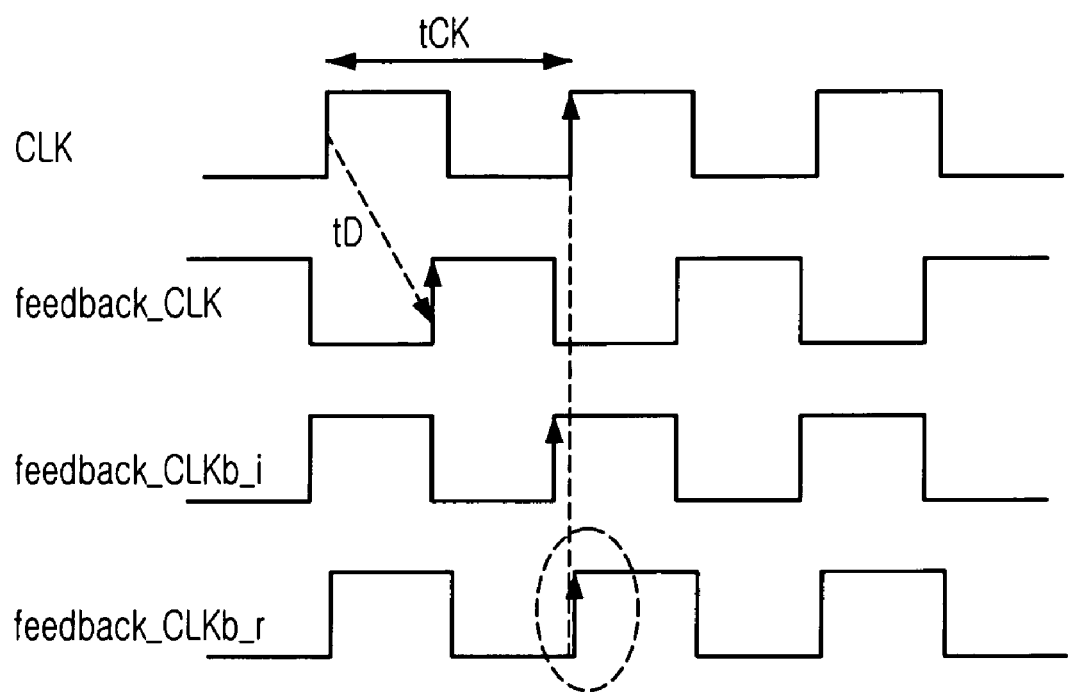
FIG. 5 is a timing diagram setting forth a phase error according to another conventional DLL.
Figure 6:
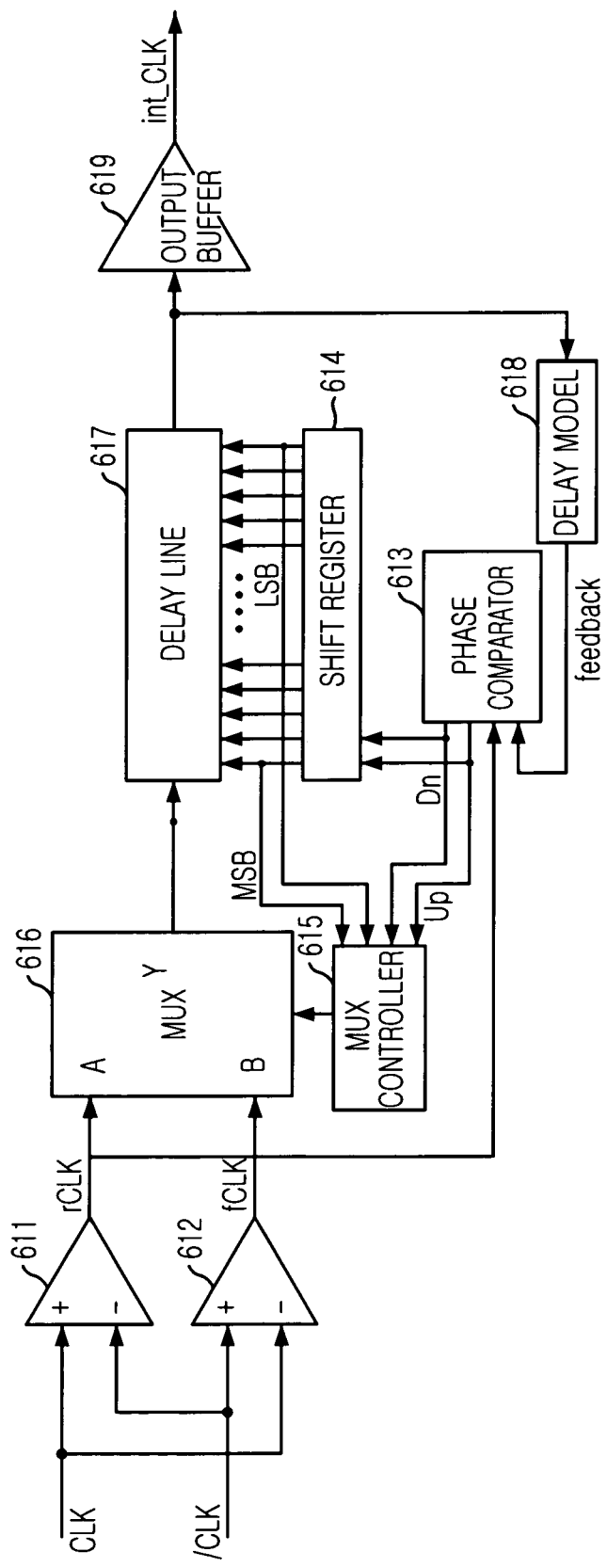
FIG. 6 is a block diagram setting forth a delay locked loop of a semiconductor memory device in accordance with a preferred embodiment of the present invention.

FIG. 6 is a block diagram setting forth a delay locked loop (DLL) of a semiconductor memory device in accordance with a preferred embodiment of the present invention.

Referring to FIG. 6, the inventive DLL includes a first and a second input buffers 611 and 612, a phase comparator 613, a shift register 614, a multiplexer selector 615, a multiplexer 616, a delay line 617 and an output buffer 619. In accordance with the present invention, the multiplexer selector 615 of the inventive DLL utilizes a maximum shift bit MSB and a minimum shift bit LSB among outputs of the shift register as well as the outputs of the phase comparator 613.

In detail, the first input buffer 611 receives an external clock signal CLK through a positive terminal and receives an external clock bar signal /CLK through a negative terminal so as to output a rising clock signal rclk. That is, the first input buffer 611 outputs the rising clock signal rclk corresponding to an in-phase of the external clock signal CLK. The second input buffer 612 receives an external clock bar signal /CLK through a positive terminal and receives an external clock signal CLK through a negative terminal so as to output a falling clock signal fclk. That is, the second input buffer 612 outputs the falling clock signal fclk corresponding to an out-of-phase of the external clock signal CLK.

At an initial operation state, the multiplexer selector 615 is operated in order that the multiplexer 616 outputs a predetermined clock corresponding to the in-phase of the external clock CLK. The rising clock rclk of the multiplexer 616 is outputted through a minimum number of delay units in the delay line 617 at the initial operation state.

The clock signal outputted from the delay line 617 is inputted to the delay model 618. Then, the phase comparator 613 compares a phase of a rising edge of the rising clock rclk with a phase of a rising edge of the feedback clock feedback outputted from the delay model 618. That is, the phase comparator 613 outputs an up-signal UP for increasing a delay amount in case that the rising clock is in logic low level at the rising clock of the feedback clock feedback. On the contrary, the phase comparator 613 outputs a down-signal DN for reducing the delay amount in case that the rising clock is in logic high level at the rising clock of the feedback clock feedback.

Figure 7:
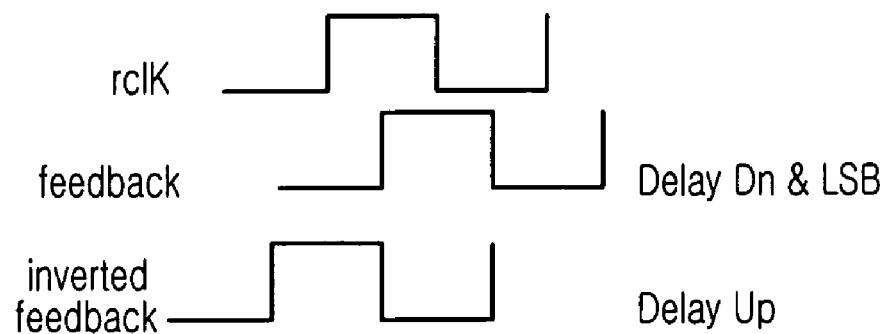
FIGS. 7 and 8 are timing diagrams setting forth a locking procedure of the DLL in accordance with the preferred embodiment of the present invention.
Figure 8:
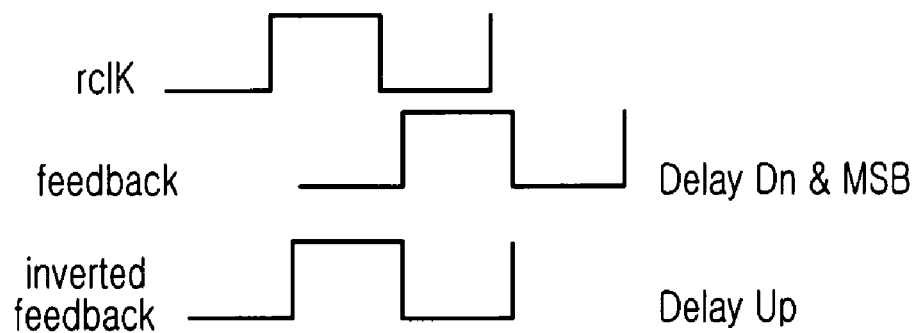

FIGS. 7 and 8 are timing diagrams setting forth a locking operation of the DLL in accordance with the preferred embodiment of the present invention.

Referring to FIG. 7, if the down-signal DN is outputted from the phase comparator 613 at the initial operation state, it is impossible to additionally reducing the delay amount. Therefore, in this case, the phase of the clock signal inputted to the delay line 617 from the multiplexer 616 should be inverted so that the falling clock fclk is applied to the delay line 617 instead of the rising clock rclk. As a result, the rising clock rclk becomes in logic low level at the rising edge of the feedback clock feedback so that the phase comparator 613 outputs the up-signal UP to increase the delay amount.

On the other hand, referring to FIG. 8, if the up-signal UP is still outputted in spite of maximally increasing the delay amount of the delay line 617, the phase of the clock inputted to the delay line 617 should be inverted for outputting the down-signal DN so as to decrease the delay amount.

Figure 9:
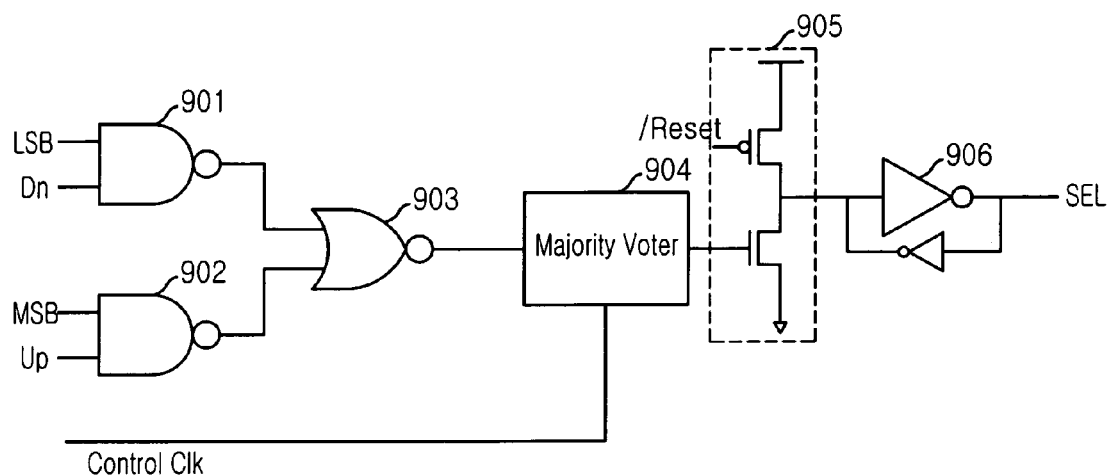
FIG. 9 is a circuit diagram setting forth the multiplexer of the DLL in accordance with the preferred embodiment of the present invention.

FIG. 9 is a circuit diagram setting forth the multiplexer 616 of the inventive DLL in accordance with the preferred embodiment of the present invention.

Referring to FIG. 9, the multiplexer 616 of the present invention is provided with a first NAND gate 901 for performing a logic NAND operation to the minimum shift bit signal LSB and the down-signal DN, a second NAND gate 902 for performing the maximum shift bit signal MSB and the up-signal UP, a NOR gate 903 for performing the outputs of the first NAND and the second NAND gates 901 and 902, a majority voter 904 for transferring the output of the NOR gate 903 controlled by the control signal, a switch 905 for performing a switching operation by means of the output signal of the majority voter 904 and performing a reset operation by means of a reset bar signal /Reset, and a latch 906 for latching the output of the switch 905. Herein, the switch 905 is configured with a PMOS transistor for outputting a power voltage controlled by the reset bar signal /Reset and an NMOS transistor for outputting a ground voltage controlled by the majority voter 904.

Figure 10:
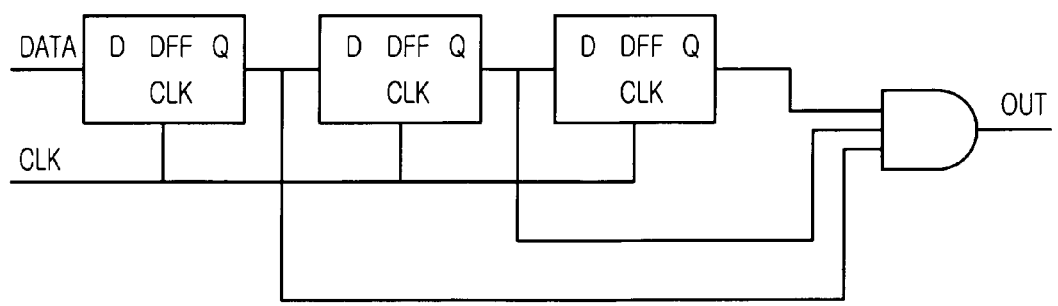
FIG. 10 is a block diagram setting forth the majority voter of the multiplexer in accordance with the preferred embodiment of the present invention.

FIG. 10 is a block diagram setting forth the majority voter 904 of the multiplexer 616 in accordance with the preferred embodiment of the present invention.

In FIG. 10, the majority voter 904 is configured with a first, a second and a third D flip-flops and a NAND gate where the outputs of the first to the third D flip-flops are inputted. In detail, the output of the NOR gate 903 in the multiplexer 616 is inputted to the first D flip-flop. Herein, the control clock may become the rising clock or the divided rising clock according to various conditions.

As described above, the present invention provides an advantageous merit that it is possible to prevent a stuck fail incurred by an external noise. Furthermore, in accordance with the present invention, it is possible to employ the delay line corresponding to a half period of the operational frequency so as to reduce unnecessary current consumption. In addition, since there is not employed a divider, there are another advantages that a phase distortion can be removed and a locking operation can be facilitated in spite of a low operational frequency.

The present application contains subject matter related to the Korean patent application No. KR 2004-87313, filled in the Korean Patent Office on Oct. 29, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop with at least one delay line, comprising:
   a buffering means for outputting a first clock corresponding to an in-phase of an external clock and outputting a second clock corresponding to an out-of-phase of the external clock;
   a phase comparing means for outputting a control signal to increase/decrease a delay amount after comparing the first clock with a phase of a feedback clock;
   a shift register for outputting a shift signal in accordance with the control signal;
   a multiplexing means for selecting one between the first and the second clocks by using the output of the phase comparator and the output of the shift register.

2. The delay locked loop as recited in claim 1, wherein the multiplexing means selects the second clock in case that the control signal to decrease the delay amount is inputted thereto when the first clock lags behind the feedback clock.

3. The delay locked loop as recited in claim 1, wherein the multiplexing means selects the first clock in case that the control signal to increase the delay amount is inputted thereto when the second clock leads to the feedback clock.

4. The delay locked loop as recited in claim 1, wherein the output of the shift register which is inputted into the multiplexing means is a maximum shift bit signal or a minimum shift bit signal.

5. The delay locked loop as recited in claim 1, wherein the phase comparing means outputs the control signal to increase the delay amount when the first signal is in logic low level at a rising edge of the feedback clock, and outputs the control signal to decrease the delay amount when the first signal is in logic high level at a rising edge of the feedback clock.

6. The delay locked loop as recited in claim 4, wherein the multiplexing means includes:
   a multiplexer selector for outputting a selection signal to select one between the first and the second clocks by using the output of the phase comparator and the output of the shift register; and
   a multiplexer for outputting the selected one between the first and the second clocks of the buffer.

7. The delay locked loop as recited in claim 6, wherein the multiplexer selector includes:
   a first NAND gate for performing a logic NAND operation to the minimum shift bit signal and the command to decrease the delay amount;
   a second NAND gate for performing a logic NAND operation to the maximum shift bit signal and the command to increase the delay amount;
   a NOR gate for performing a logic NOR operation to the outputs of the first and the second NAND gates;
   a majority voter for outputting a predetermined signal when the output of the NOR gate is maintained for a predetermined time;
   a switch which is switched by the output of the majority voter and is reset by a reset signal; and
   a latch for latching the output of the switch.

8. The delay locked loop as recited in claim 7, wherein the majority voter includes:
   a first to a third D flip-flops which are connected in series for receiving the output of the NOR gate of the majority voter; and
   an AND gate for performing a logic AND operation to the first to the third D flip-flops.

9. The delay locked loop as recited in claim 8, wherein the buffer includes:
   a first input buffer for receiving the external clock signal though a positive terminal thereof and receiving an external clock bar signal through a negative terminal thereof; and
   a second input buffer for receiving the external clock signal though a negative terminal thereof and receiving the external clock bar signal through a positive terminal thereof.

10. A delay locked loop with at least one delay line, comprising:
    a buffering means for outputting a first clock corresponding to an in-phase of an external clock and outputting a second clock corresponding to an out-of-phase of the external clock;
    a phase comparing means for outputting a control signal to increase/decrease a delay amount after comparing a phase of the external clock with a phase of a feedback clock;
    a shift register for outputting a shift signal in accordance with the control signal;
    a multiplexing means for selecting one between the first and the second clocks by using the output of the phase comparator and the output of the shift register.

11. The delay locked loop as recited in claim 10, wherein the multiplexing means selects the first clock in case that the control signal to increase the delay amount is inputted thereto when the second clock leads to the feedback clock.

12. The delay locked loop as recited in claim 10, wherein the multiplexing means selects the first clock in case that the control signal to increase the delay amount is inputted thereto when the second clock leads to the feedback clock.

13. The delay locked loop as recited in claim 10, wherein the multiplexing means includes:
    a multiplexer selector for outputting a selection signal to select one between the first and the second clocks by using the output of the phase comparator and the output of the shift register; and
    a multiplexer for outputting the selected one between the first and the second clocks from the buffer.

14. The delay locked loop as recited in claim 13, wherein the multiplexer selector includes:
    a first NAND gate for performing a logic NAND operation to the minimum shift bit signal and the command to decrease the delay amount;
    a second NAND gate for performing a logic NAND operation to the maximum shift bit signal and the command to increase the delay amount;
    a NOR gate for performing a logic NOR operation to the outputs of the first and the second NAND gates;
    a majority voter for outputting a predetermined signal when the output of the NOR gate is maintained for a predetermined time;
    a switch which is switched by the output of the majority voter and is reset by a reset signal; and
    a latch for latching the output of the switch.

15. A locking method of a delay locked loop with at least one delay line, comprising the steps of:
    a) outputting a first clock corresponding to an in-phase of an external clock and a second clock corresponding to an out-of-phase of the external clock;
    b) outputting a command to increase or decrease a delay amount by comparing a phase of the external clock with a phase of a feedback clock;
    c) outputting a shift signal in accordance with the command to increase or decrease the delay amount; and
    d) selecting one clock between the first and the second clocks by using the command and the shift signal.

16. The locking method as recited in claim 15, wherein the step d) is performed to select the other clock in case that the command to decrease the delay amount is inputted when a phase of one of the first and the second clock passing through the delay line is delayed minimally.

17. The locking method as recited in claim 15, wherein the step d) is performed to select the other clock in case that the command to increase the delay amount is inputted when a phase of one of the first and the second clock passing through the delay line is delayed maximally.

18. The locking method as recited in claim 15, wherein the step d) includes the steps of:
    d1) outputting a selection signal for selecting one of the first and the second clocks by using the command and the shift signal; and
    d2) outputting the selected one of the first and the second clocks controlled by a control signal.

* * * * *